United States Patent
Feiweier et al.

(10) Patent No.: US 10,401,460 B2
(45) Date of Patent: Sep. 3, 2019

(54) METHOD AND MAGNETIC RESONANCE APPARATUS FOR ACQUIRING MAGNETIC RESONANCE DATASET WITH REDUCED SUSCEPTIBILITY ARTIFACTS IN THE RECONSTRUCTION IMAGE

(71) Applicant: Siemens Healthcare GmbH, Erlangen (DE)

(72) Inventors: Thorsten Feiweier, Poxdorf (DE); Josef Pfeuffer, Kunreuth (DE); Daniel Nico Splitthoff, Erlangen (DE)

(73) Assignee: Siemens Healthcare GmbH, Erlangen (DE)

( * ) Notice: Subject to any disclaimer, the term of this patent is extended or adjusted under 35 U.S.C. 154(b) by 193 days.

(21) Appl. No.: 15/442,729

(22) Filed: Feb. 27, 2017

(65) Prior Publication Data

US 2017/0248672 A1  Aug. 31, 2017

(30) Foreign Application Priority Data

Feb. 29, 2016  (DE) .......................... 10 2016 203 253

(51) Int. Cl.
*G01R 33/561* (2006.01)
*G01R 33/565* (2006.01)
*G01R 33/44* (2006.01)

(52) U.S. Cl.
CPC ..... *G01R 33/56536* (2013.01); *G01R 33/443* (2013.01); *G01R 33/5616* (2013.01)

(58) Field of Classification Search
USPC .......................... 324/300–322; 600/407–435; 382/128–131
See application file for complete search history.

(56) References Cited

U.S. PATENT DOCUMENTS

| | | | | |
|---|---|---|---|---|
| 6,946,839 B2 * | 9/2005 | Porter | ................ | G01R 33/5615 324/307 |
| 7,476,330 B2 * | 1/2009 | Barbara | ................ | G01R 33/387 252/500 |
| 7,560,922 B2 * | 7/2009 | Barbara | ................ | G01R 33/387 324/300 |
| 8,138,759 B2 * | 3/2012 | Greiser | .............. | G01R 33/3875 324/309 |

(Continued)

OTHER PUBLICATIONS

Yang .et al.: "Multi-Gradient Echo with Susceptibility Inhomogeneity Compensation (MGESIC): Demonstration of JMRI in the Olfactory Cortex at 3.0 T"; in: Magnetic Resonance in Medicine; vol. 37; pp. 331-335; (1997).

(Continued)

*Primary Examiner* — Melissa J Koval
*Assistant Examiner* — Tiffany A Fetzner
(74) *Attorney, Agent, or Firm* — Schiff Hardin LLP

(57) ABSTRACT

In a method and apparatus for recording a magnetic resonance dataset of a volume of interest of an object, at least one gradient moment is calculated as a function of at least one jump in susceptibility that is present in the volume of interest, between two sections of the volume of interest. An excitation pulse is radiated and at least one compensation moment is activated in a part volume of the volume of interest, for the at least partial compensation of a gradient moment caused by the jump in susceptibility. The signal generated by the excitation pulse is read out.

17 Claims, 5 Drawing Sheets

(56) References Cited

U.S. PATENT DOCUMENTS

| | | | |
|---|---|---|---|
| 2004/0257078 A1* | 12/2004 | Porter | G01R 33/5615 324/307 |
| 2005/0062022 A1* | 3/2005 | Barbara | G01R 33/387 252/500 |
| 2009/0021259 A1* | 1/2009 | Barbara | G01R 33/387 324/318 |
| 2010/0127702 A1* | 5/2010 | Greiser | G01R 33/3875 324/309 |
| 2010/0286802 A1 | 11/2010 | Feiweier et al. | |
| 2015/0285877 A1 | 10/2015 | Pfeuffer et al. | |
| 2016/0033602 A1 | 2/2016 | Fritz et al. | |
| 2016/0091584 A1 | 3/2016 | Feiweier | |
| 2016/0091586 A1 | 3/2016 | Benner et al. | |
| 2016/0091587 A1 | 3/2016 | Benner et al. | |
| 2016/0091588 A1 | 3/2016 | Benner et al. | |
| 2016/0091589 A1 | 3/2016 | Benner et al. | |
| 2016/0091590 A1 | 3/2016 | Benner et al. | |
| 2016/0209487 A1 | 7/2016 | Stern et al. | |
| 2017/0248672 A1* | 8/2017 | Feiweier | G01R 33/443 |

OTHER PUBLICATIONS

Yip, et. al.; "Spectral-Spatial Pulse Design for Through-Plane Phase Precompensatory Slice Selection in T*2-Weighted Functional MRI"; Magnetic Resonance in Medicine; vol. 61, pp. 1137-1147; (2009).

Collins, et al.: "Numerical calculations of the static magnetic field in three-dimensional multi-tissue models of the human head"; in: Magnetic Resonance Imaging; vol. 20; pp. 413-424; (2002).

Ladd et al. "Biopsy needle susceptibility artifacts", Magn Reson Med, vol. 36(4), pp. 646-651; (1996).

Du, et al.: "Reducing Susceptibility Artifacts in fMRI Using Volume-Selective z-Shim Compensation", Magn.Res.Med., vol. 57, pp. 396-404; (2007).

Port et.al,.: "Quantification and Minimization of Magnetic Susceptibility Artifacts on GRE Images", Journal of Computer Assisted Tomography vol. 34, No. 6, pp. 958-964; (2000).

Schneider et. al.: "Automated Slice-Specific Simultaneous Z-Shim Method for Reducing B1 Inhomogeneity and Susceptibility-Induced Signal Loss with Parallel Transmission at 3T", Magn.Reson. in Medicine, vol. 74, pp. 934-944; (2015).

Jakob, et.al.: "Rapid Quantitative LUNG $^1$H $T_1$-Mapping", Journal of Magnetic Resonance Imaging, vol. 14, pp. 795-799; (2001).

* cited by examiner

METHOD AND MAGNETIC RESONANCE APPARATUS FOR ACQUIRING MAGNETIC RESONANCE DATASET WITH REDUCED SUSCEPTIBILITY ARTIFACTS IN THE RECONSTRUCTION IMAGE

BACKGROUND OF THE INVENTION

Field of the Invention

The present invention concerns a method for recording a magnetic resonance dataset. The invention also relates to a data storage and a magnetic resonance apparatus that implement such a method.

Description of the Prior Art

A problem that can occur in magnetic resonance scans is the occurrence of signal voids as a result of susceptibility jumps in the tissue of the region being examined.

For example, it is known that signal voids occur at water/air transitions. This is caused by the relationship of the magnetic field strength B with the magnetic excitation H and the magnetization J:

$$B = \mu_0(H+J).$$

Since the magnetization J can also be expressed as $$J = \chi H$$

the following is obtained $$B = \mu_0 \mu_r H = \mu_0 (1+\chi) H = B_0 + \mu_0 J.$$

Therefore, a field change ΔB takes place at the boundary between two tissues or materials with different χ values:

$$\Delta B = \mu_0(\chi_1 - \chi_2) H$$

The additional gradients present at the boundaries result in dephasing of the spins, which results in signal losses.

These signal losses caused by susceptibility jumps in different tissues are also called susceptibility artifacts. These occur, inter alia, in images of the lungs or the head in the region of the nose, the frontal sinus or the auditory canals. This problem also occurs with implants, i.e. with water/metal transitions.

In this case, the degree of the susceptibility jumps depends upon the χ values. The jumps are particularly strong at water-air or water-metal transitions.

In this case, the field change ΔB generates a so-called moment. This is generally defined as follows:

$$M = \int G \, dt,$$

where G describes the spatial gradient of the field change along a specific axis and dt describes the differential of the time integral.

Several strategies are known for the reduction of susceptibility artifacts:

First: susceptibility artifacts can be eliminated by the use of spin-echo-based recording methods. In this case, one or more 180° refocusing pulses are present.

It is also possible to reduce susceptibility artifacts if the axis of the jump in susceptibility, if there is such an axis, is parallel to $B_0$. This procedure is useful, for example, when positioning surgical needles, see Ladd et al., Biopsy needle susceptibility artifacts, Magn Reson Med, 36(4), pp 646-651, 1996.

It is also possible to reduce susceptibility artifacts—so-called "in-plane dephasing" in the read and/or phase direction—in gradient-echo sequences by reducing the echo time $T_E$. It is known from Port and Pomper, Quantification and Minimization of Magnetic Susceptibility Artifacts on GRE Images., J Comput Assist Tomogr, 24(6), 958-964, 2000 that this makes the greatest contribution to the minimization of artifacts. With respect to pulmonary imaging, it is known from Jakob et al., Rapid Quantitative LUNG 1H T1-Mapping, J Magn Reson Imaging 14, pp. 795-799, 2001 to record FLASH images with an echo time of 1 ms in order to minimize susceptibility artifacts.

Furthermore, Du et al., Reducing Susceptibility Artifacts in fMRI Using Volume-Selective z-Shim Compensation, Magn. Res. Med., 57, pp. 396-404, 2007 and Schneider et al., Automated Slice-Specific Simultaneous Z-Shim Method for Reducing B1 Inhomogeneity and Susceptibility-Induced Signal Loss with Parallel Transmission at 3T, Magn. Reson. Med., 74, pp 934-944, 2014 describe so-called z-shim correction. In this case, in addition to the artifact-affected image datasets, image datasets are recorded using an additional moment in the slice direction, which corrects so-called "through-plane dephasing" and assembles the image datasets to form a combination image. This procedure is described by the term "z-shim". However, in this case, the calculation of the additional moments is partially empirical and time-consuming.

SUMMARY OF THE INVENTION

An object of the present invention is to provide a method and a magnetic resonance apparatus and a non-transitory, computer-readable data medium with which susceptibility artifacts can be reduced and wherein the method is less susceptible to errors.

This object is achieved according to the invention by a method of the type cited initially with the following steps:

a) automated calculation of at least one compensation moment as a function of at least one jump in susceptibility present in the region of interest between two sections of a region of interest, b) application of an excitation pulse, c) application of the at least one compensation moment for the at least partial compensation of a gradient moment caused by the jump in susceptibility, and d) reading-out the signal generated by the excitation pulse.

In this context, the core of the invention is that the compensation moment for the compensation of one or more susceptibility jumps is calculated in an automated way, and hence can also be inserted in a recording sequence in an automated and optimized way.

In this context, the way in which the compensation moment is inserted is in principle irrelevant. It is only essential for the calculation to be performed in an automated way and not on the basis of estimations.

For example, the part volume can be defined by signal threshold values and pattern recognition in an adjustment image dataset that is to be recorded in advance. Metal and air do not emit a signal in proton images and can, therefore, be differentiated from proton-containing tissue.

Since air is not tissue in the narrower sense, the jump in susceptibility was defined as lying between two sections. These sections have different χ values, otherwise there would be no jump in susceptibility. The same applies to metal objects in the region of interest.

With previously recorded adjustment image data, which can be two-dimensional or three-dimensional depending on the issue in question, the known strategies can be used to avoid susceptibility artifacts; inter alia it is possible to minimize the echo time.

The adjustment image dataset can also be used to define the magnitude of the jump in susceptibility or the susceptibility jumps.

Alternatively, the $B_0$ inhomogeneity can be determined in the volume of interest, for example by determining deviations from a $B_0$ reference value. This $B_0$ map or $B_0$ inhomogeneity map can be used to determine a compensation moment.

This can alternatively or additionally be performed with a $B_1$ map.

It is subsequently also possible to define in an automated way as to when and how often which part of the compensation moment is switched.

The compensation moment can extend over one or more axes. It can, for example, be applied only in the slice direction or in the slice and phase and read directions.

In the simplest case, with a simple gradient-echo sequence it is possible during the recording of a k-space line, for the full compensation moment to be applied in each case between the excitation pulse and the reading-out of the signal.

In the case of sequences with a complicated structure, such as EPI, it is possible for the entire compensation moment to be applied after an excitation pulse or for a partial moment to be applied in each case before the read-out phases. It is in particular possible for the compensation moment to be divided into equal parts.

In this context, the automatic calculation and distribution of the compensation moment enables the division to be varied without any user interaction. In this context, it is even possible, between the described or further possibilities, to alternate during the scan from one excitation cycle to the next and, to be precise, also as a function of boundary conditions such as the position of the jump in susceptibility. This position can change as a result of movements of the object to be examined.

The position of susceptibility jumps can be tracked with navigator echoes. This also enables a change to the compensation moment to be determined "on-the-fly". Accordingly, it is also possible for the position or magnitude of the compensation moment to be adapted during the scan.

Alternatively, it is possible for the position of the susceptibility jumps to be determined by means of external recording mechanisms such as cameras. This then requires the position of the susceptibility jumps to be registered.

A gradient can be used to generate the compensation moment. In this context, "gradient" is the usual abbreviated term for a magnetic field gradient that can be generated by means of gradient coils. Said gradient can be applied selectively to individual slices or partial volumes and can in particular be applied at virtually any points of time.

Alternatively or additionally, a radio-frequency pulse can be used to generate the compensation moment. The high-frequency pulse can be used to apply a $B_1$ field.

The excitation pulse can be modified such that it provides the required compensation moment in the desired slice. The steps b) and c) are then performed simultaneously.

In this context, the compensation moment can, as described, only be applied in a sub-region of the region of interest. This is advantageous since the susceptibility jumps only occur in a sub-region of the region of interest. In addition, a compensation moment is only necessary in the regions in which the additional gradient □B occurs.

The compensation moment then acts on the sub-region of the region of interest in which the susceptibility jump or jumps are present.

Preferably, a gradient-echo-based method is used to record the magnetic resonance dataset. The method described can, in principle, be used with all scanning methods, i.e. also with spin-echo-based methods or mixed methods such as GRASE. However, the greatest advantages are obtained with gradient-echo-based methods.

It is also possible to use an imaging method. In particular EPI methods or sequences are susceptible to susceptibility artifacts which is why a compensation moment has particular advantages in such cases.

The following is preferable with respect to a test subject or patient as an object to be examined:

The compensation moment can preferably be applied in a region of the head, in particular in a region around the nose.

The compensation moment can also be applied in a region of the upper body, in particular in a region of the lungs.

Particularly large susceptibility jumps occur in these regions. This means that, on the one hand, a correction is needed, while, on the other, the correction is also to be limited to these regions.

The compensation moment can be determined using at least one piece of information on the at least one jump in susceptibility in the region of interest. To this end, it is possible, as described, to use $B_0$ maps or even $B_1$ maps. However, unlike the known procedure, the correction moment or compensation moment calculated therefrom is not applied for the entire duration of the sequence, but for a short time only. In particular, the compensation moment should not be applied during the switching of imaging gradients.

In this context, the aforementioned methods can be implemented in the control apparatus as software or as (hard-wired) hardware.

The present invention also encompasses a non-transitory, computer-readable data storage medium encoded with programming instructions that, when the storage medium is loaded into a computer system of a magnetic resonance apparatus, cause the computer system to operate the magnetic resonance apparatus in accordance with the inventive method as described above.

The present invention also encompasses a magnetic resonance apparatus having a data acquisition scanner with an RF radiator, an RF receiver, a gradient coil arrangement, and a control computer, wherein the control computer is configured to operate the components of the data acquisition scanner in accordance with the inventive method as described above.

The magnetic resonance apparatus has at least one gradient coil, preferably comprises three gradient coils.

The embodiments of the magnetic resonance apparatus according to the invention correspond to embodiments of the method according to the invention.

DESCRIPTION OF THE PREFERRED EMBODIMENTS

Figure 1:
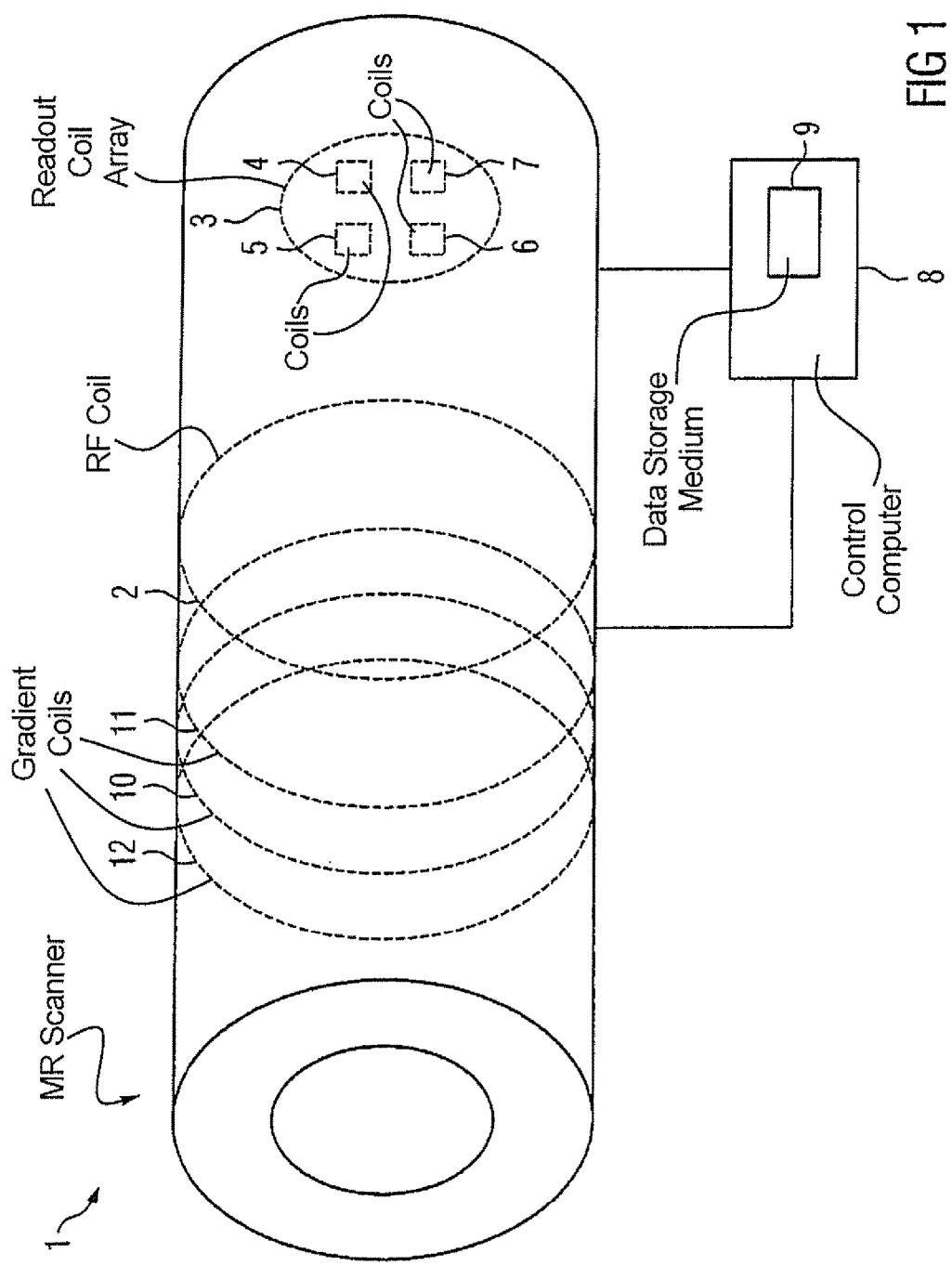
FIG. 1 is a block diagram of a magnetic resonance apparatus constructed and operating in accordance with the present invention.

FIG. 1 schematically illustrates a magnetic resonance scanner 1. This scanner 1 has a radio-frequency coil 2 embodied as a body coil, a coil array 3 with coils 4, 5, 6 and 7, and a control computer 8. The coil 2 is used for the excitation of nuclear spins so as to deflect their magnetization, and accordingly functions as a transmitter coil. The coil array 3 is used to read out the scan signal and represents the receiver coil unit. The coils 4, 5, 6 and 7 of the coil array 3 read out the scan signal simultaneously. Instead of the coil array 3, it is also possible to use an individual coil as a detection coil.

Also known are coils that function simultaneously as excitation and detection coils. These can also be used to carry out the method described below.

The magnetic resonance scanner 1 further comprises a data storage medium 9 as part of the control computer 8 or independently thereof on which computer code for carrying out magnetic-resonance scans are stored.

The only precondition for this are the gradient coils 10, 11 and 12, which are depicted schematically, but these are necessarily present in all magnetic-resonance devices. The gradient coils 10, 11 and 12 generate gradient fields in three directions. These are usually designated x, y and z. These are superimposed in order to generate the gradients used in a recording sequence, which lie in the read-out, phase and slice direction. This means that, depending upon their position, the gradients used in a sequence are made up of the gradients in the x, y and z directions or in any combination.

The gradient coils 10, 11 and 12 and a corresponding scan sequence can be used to compile spatially resolved $B_0$ or $B_1$ maps that can be used to calculate the magnitude of susceptibility jumps. A compensation or balancing moment can then be determined from this.

In this context, it is assumed that, without the susceptibility jumps, the $B_0$ or $B_1$ field would be constant. Alternatively, it is also possible for $B_1$ correction maps that are dependent on the pulse shape to be taken into account.

In the $B_0$ or $B_1$ map, it is possible for all noise-induced fluctuations to be filtered out using a threshold value in order then to determine the magnitude and position of susceptibility jumps.

If the position of the susceptibility jumps is to be tracked, the $B_0$ or $B_1$ map can also be used to define the parameters for navigator echoes.

Figure 2:
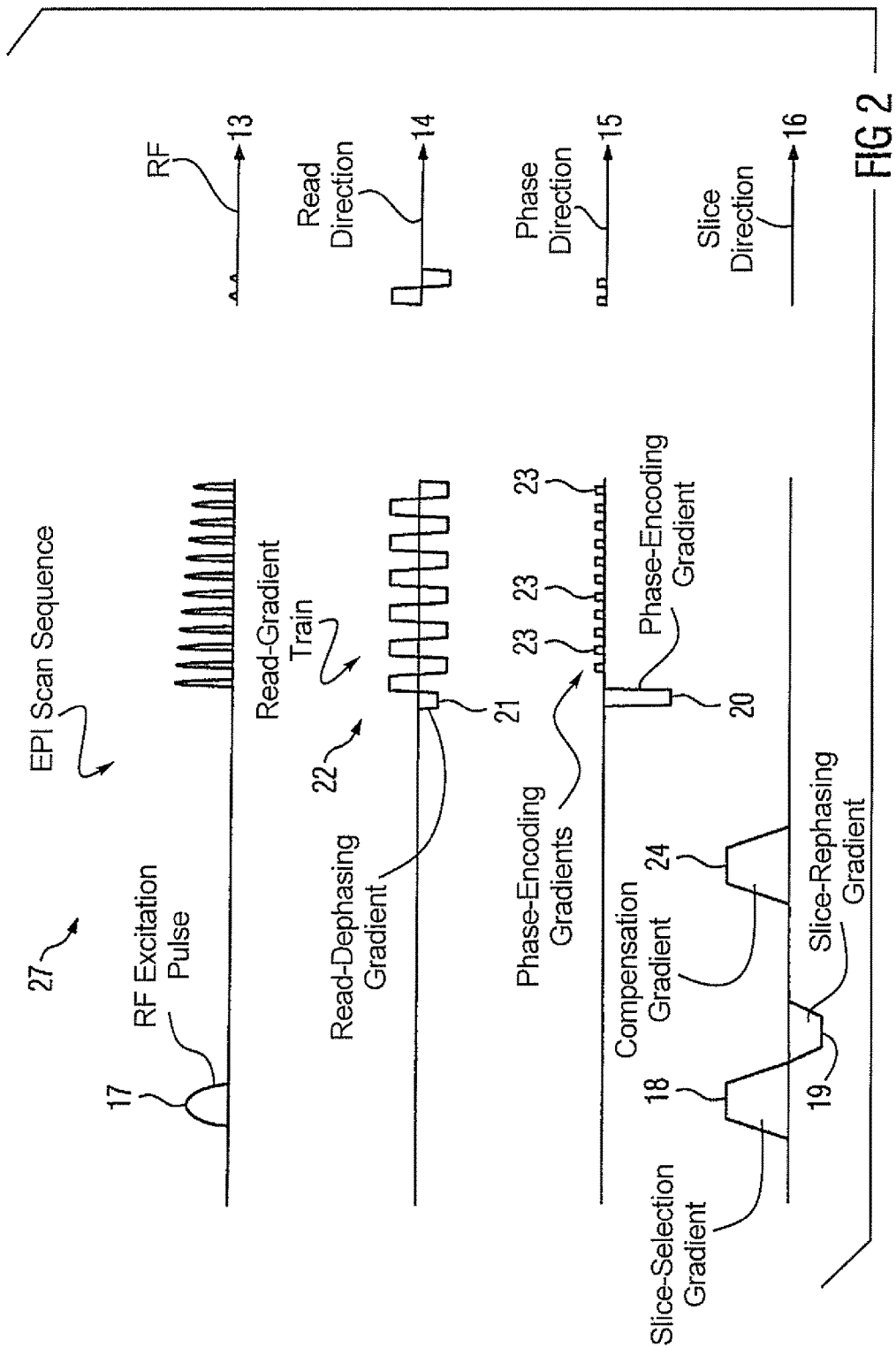
FIG. 2 shows a first embodiment of a sequence diagram in accordance with the present invention.

FIG. 2 shows a first embodiment of the sequence diagram of an EPI scan sequence 27. EPI enables image datasets to be recorded in one train and so EPI is frequently used as an imaging module according to a T2 or diffusion-preparation module. Due to the numerous gradient echoes, EPI is particularly susceptible to susceptibility artifacts.

In this context, as in the following sequence diagrams, the axes 13, 14, 15 and 16 stand for a temporal sequence, the axis 13 for the radio-frequency pulses, also known as RF pulses and the scan signal, the axis 14 for the read direction, the axis 15 for the phase direction and the axis 16 for the slice direction. Generally, and not only with reference to the axes, the same reference numbers are used for the same subject matter without this being explicitly stated with respect to FIG. 3 or FIG. 4.

Also depicted in addition to the radio-frequency pulse 17 as an excitation pulse for the EPI-scan sequence 27 are a slice-selection gradient 18, a slice-rephasing gradient 19, a phase-encoding gradient 20 and a read-dephasing gradient 21.

The read-gradient train 22 and the phase-encoding gradients 23 for encoding the k-space lines embodied as so-called blips are known and do not therefore require more detailed explanation. The omission indicates the gradient circuits that are not shown.

In FIG. 2, the embodiment of the compensation moment is shown as a moment generated via a gradient. This gradient is the compensation gradient 24. In this context, the magnitude and duration of the compensation gradient is, as described, determined automatically. In this context, the compensation gradient at least partially generates a compensation moment for the moment that forms due to the gradient ΔB induced by susceptibility jumps.

In this context, the compensation gradient 24 is implemented as a coherent gradient circuit.

FIG. 2 shows purely by way of example a compensation moment in the direction of the Z-axis. However, as described above, the compensation moment can be applied in any directions desired.

Figure 3:
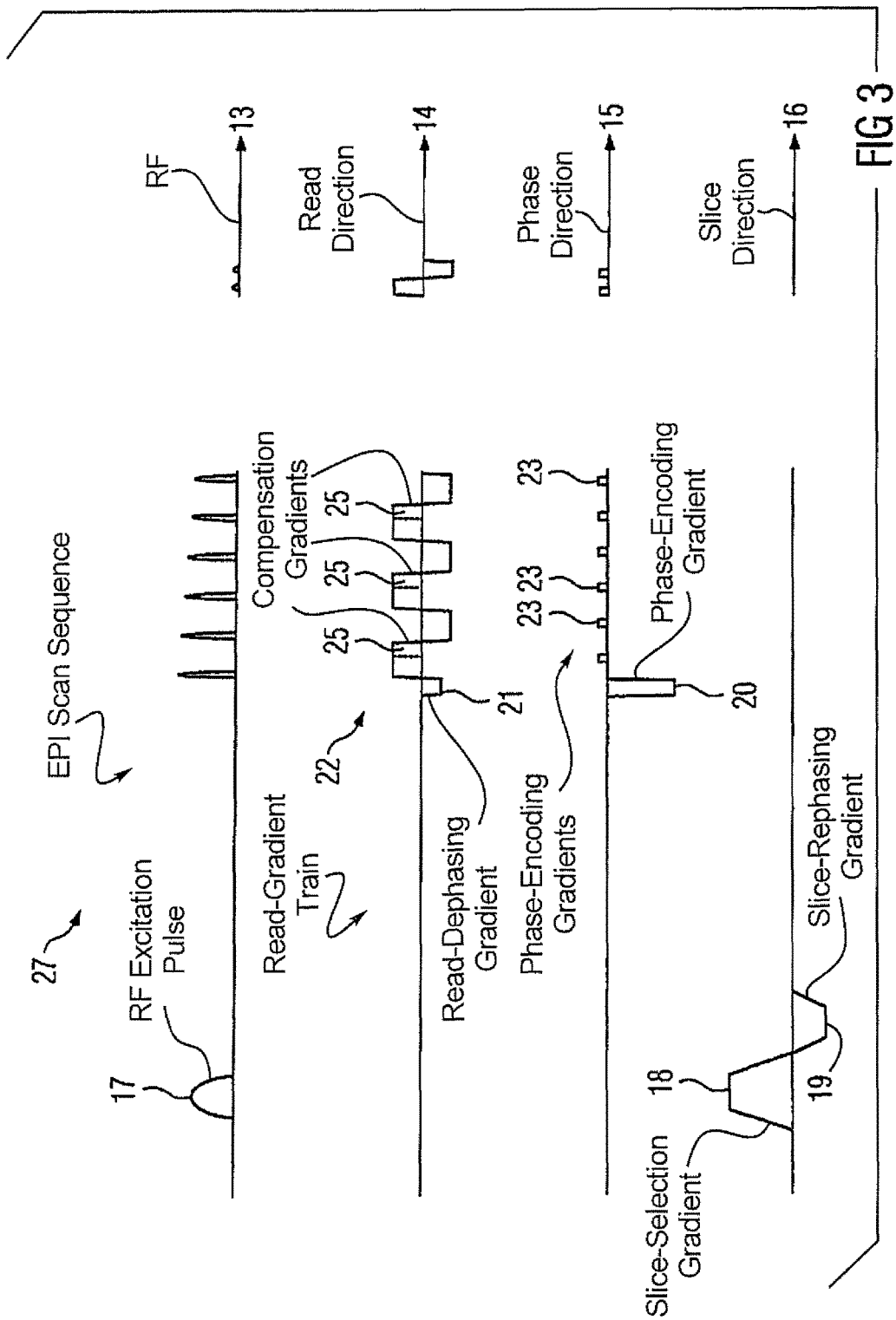
FIG. 3 shows a second embodiment of a sequence diagram in accordance with the present invention.

FIG. 3 shows an alternative implementation of the compensation moment, which is again generated via gradients. In this context, the compensation moment is obtained as the sum of a plurality of compensation gradients 25, which overall, i.e. in the moment, correspond to the compensation gradient 24 of FIG. 2. Once again, these can be used in any directions desired; here, they are shown purely by way of example in the read-out direction.

The read-out gradients 25 are formed in that the gradients of the read-gradient train 22, and to be more precise, every second one, remain switched after the reading out until the desired moment is achieved. This additional time is to be taken into account when calculating the recording parameters.

The compensation gradients 25 can preferably generate the same or even different moments.

In particular, in one sequence, the gradients 24 and 25 for generating the compensation moments can be generated differently in different directions, for example coherently in the slice direction as in FIG. 2 and with a plurality of gradients in the read-out and/or phase directions as in FIG. 3.

Figure 4:
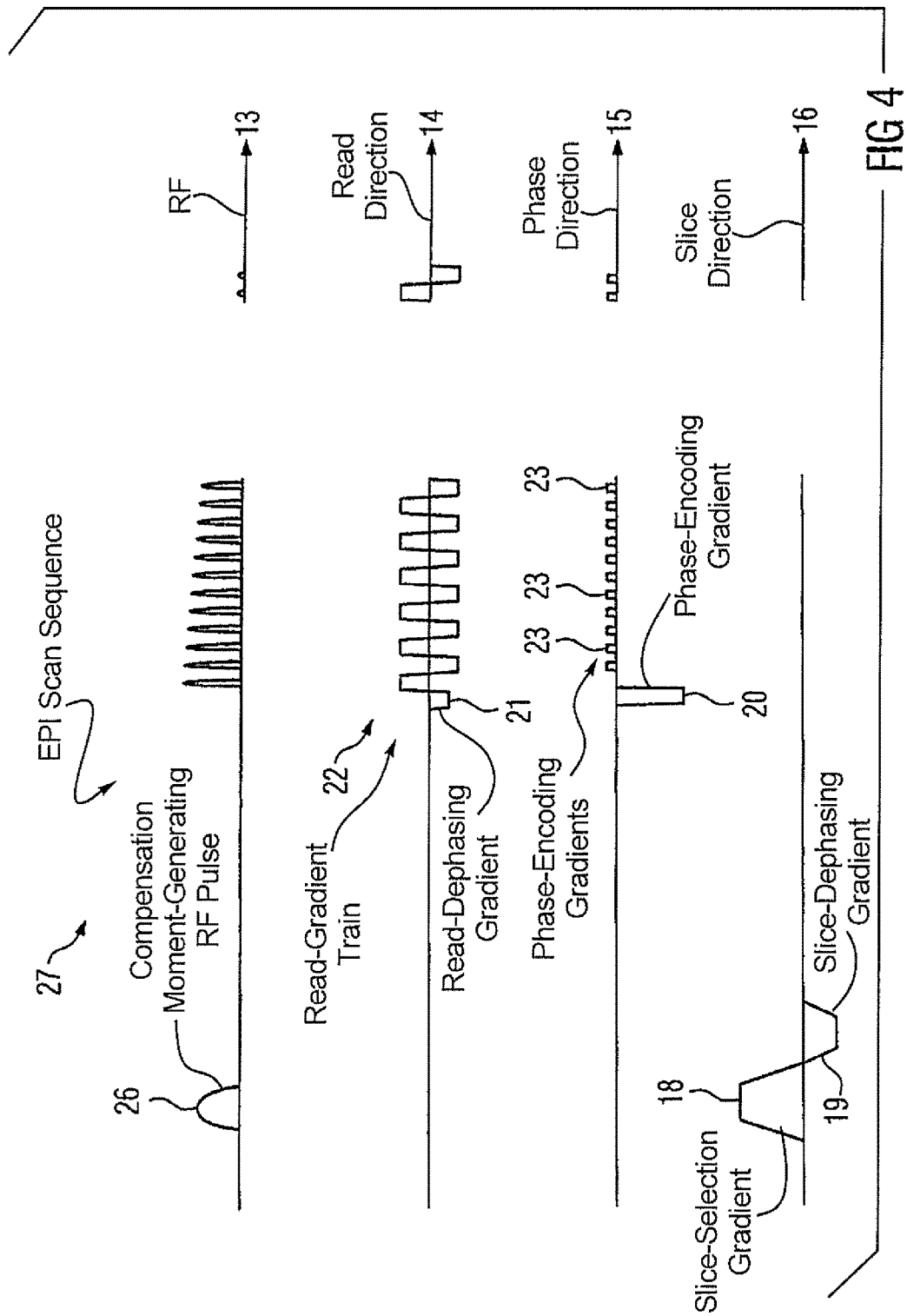
FIG. 4 shows a third embodiment of a sequence diagram in accordance with the present invention.

FIG. 4 shows an EPI-scan sequence 27, with which the compensation moment is generated via a radio-frequency pulse 26. In this context, a time shift in the channels of the transmitter coil 2 is used to maintain the desired compensation moment. Therefore, the scan sequence 27 in FIG. 4 should not be considered to differ from a known EPI scan sequence.

Figure 5:
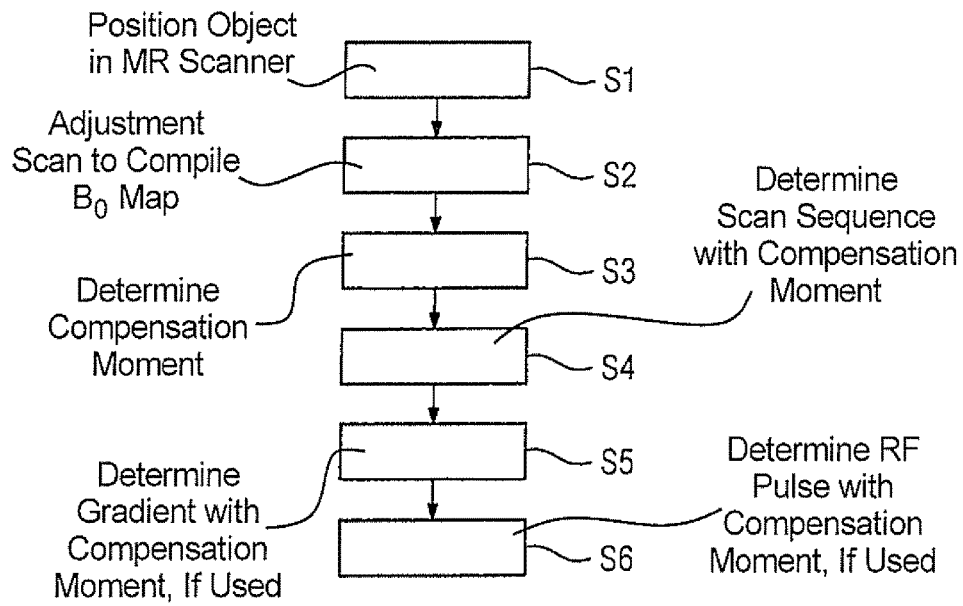
FIG. 5 is a flowchart of a first embodiment of the present invention.

FIG. 5 shows a flow diagram for recording a magnetic resonance scanner.

In step S1, the object to be examined is positioned in the magnetic resonance device.

Following this, adjustment scans are performed as step S2 with which a $B_0$ map is also compiled.

In step S3, it is determined in an automated way from the $B_0$ map whether a, and if so which, compensation moment is required in order to compensate any gradients ΔB present and generated by susceptibility jumps. In this context, it is possible to determine the position and magnitude of the compensation moment required.

It is also possible for the position of the slices or slabs to be extracted automatically.

The magnitude and direction of the compensation moment can be used in step S4 to determine as a function of the scan sequence whether one or more compensation gradients 24 or 25 or a radio-frequency pulse 26 is used. For example, compensation gradients 24 can be used in the read-out and/or phase and/or slice directions. As described above, in different directions, it is also possible to use a compensation gradient 25 once in one direction and a compensation gradient 24 in another direction. If only one alternative is possible on a magnetic resonance device 1, step S4 can be omitted.

If a compensation gradient is used, the position and magnitude of the compensation gradient 24 or 25 is determined as step S5. In this context, it is possible to use preset scan sequences and for example, to use a threshold value of the compensation moment to select the scan sequence according to FIG. 2 or FIG. 3.

During the performance of the scan sequence as step S6, at least one excitation pulse is applied, a compensation moment is applied at least once in the form of a compensation gradient 24 or several times in the form of the compensation gradients 25 in a part volume of the volume of interest for the at least partial compensation of the moment ΔB caused by the jump in susceptibility and the signal generated by the excitation pulse is read out.

During sequences such as EPI, if all k-space lines are recorded in one train, a compensation gradient 24 can be switched once, in the case of waiting times between the recording of k-space lines as with a spin echo, the compensation gradients 25 can be applied on each recording of a k-space line. In this context, the magnitude or duration can be greater or longer than with an EPI since, due to the waiting time, there is no summation or a different summation of the moments.

In the case of segmented sequences, such as TSE, it is either possible to apply an individual compensation gradient 25 to each k-space line or to each segment. Then, the number of compensation gradients 25 corresponds to the number of excitation pulses; the refocusing pulses do not then count.

Therefore, typically step b) is performed once to $N_{pe}$ times, step c) once to $N_{pe}$ times and step d) $N_{pe}$ times in order to record an image dataset. In the basic embodiment, the steps b) and c) are performed at least once. In this context, $N_{pe}$ corresponds to the number of k-space lines to be recorded.

In this context, the description is aimed at two-dimensional image datasets with Cartesian k-space sampling. The modifications required to achieve three-dimensional image datasets and/or radial sampling are known.

Figure 6:
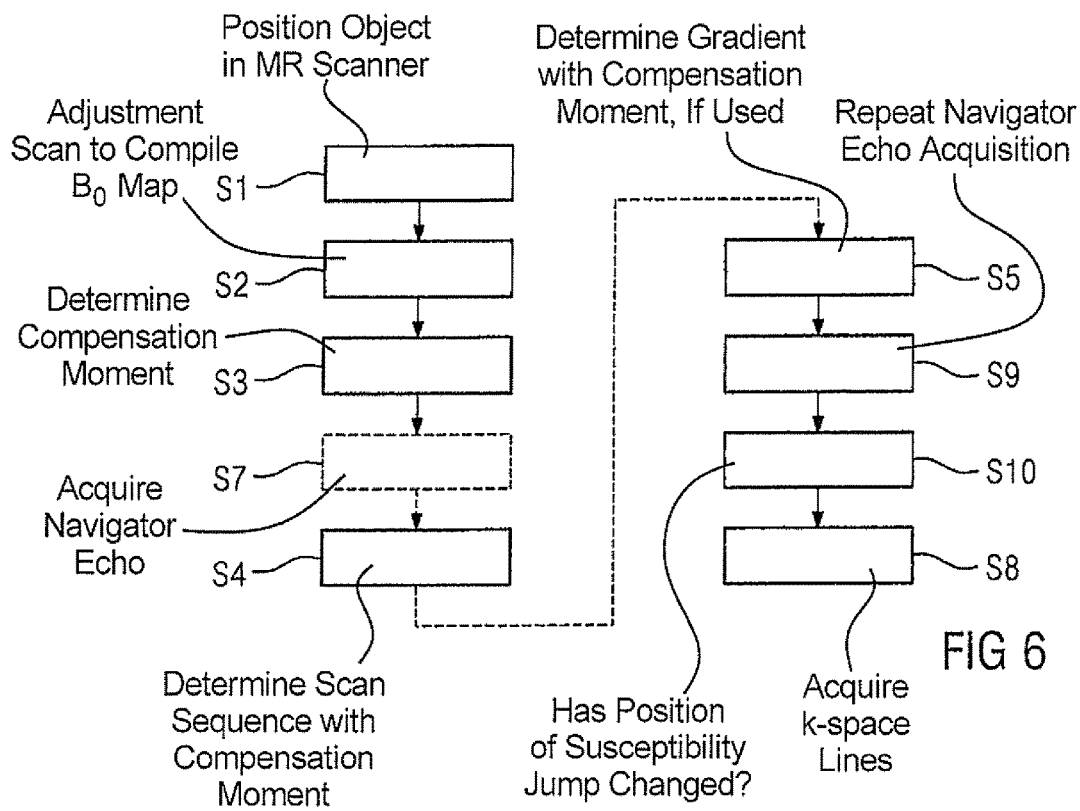
FIG. 6 is a flowchart of a second embodiment of the present invention.

FIG. 6 shows a flow diagram for recording a magnetic resonance dataset with which, in addition to the method depicted in FIG. 5, the susceptibility jumps are tracked.

In this context, the steps with the same numbering correspond to the steps described for FIG. 5.

Additionally to the steps S1 to S5, in step S7 after step S3 and before step S8, at least one reference navigator echo is recorded. Preferably, there are then three navigator echoes. This corresponds to the number of spatial axes. Three navigator echoes can be used to track the movement of the object to be examined thus enabling conclusions to be drawn regarding the position of the susceptibility jumps.

Step S9 represents the repeat recording of the navigator echoes with the determination of a change to the position of the susceptibility jumps and is performed before step S8.

In step S8, one or more k-space lines are recorded, but not an entire dataset. Therefore, before the recording of each k-space line or a segment, a check is performed in step S10 to determine whether the compensation moment, and hence the compensation gradients 25, are to be adapted.

This check with respect to the compensation moment can obviously also be performed when a radio-frequency pulse is used to generate the compensation moment.

Following the recording of the magnetic resonance dataset, the data are subjected to a plurality of processing steps such as a Fourier transformation in order to obtain an image dataset.

The image generated from the magnetic resonance dataset can also be used to form combination images.

The position of the susceptibility jumps is also possible with other methods apart from navigator echoes. Additionally or alternatively, it is also possible for field sensors or navigators to be used to identify and take account of changes to a field, for example a thermally-induced field change.

Furthermore, it is additionally or alternatively possible to take account of a movement phase. This can be a respiratory phase or a heartbeat of a test subject. In particular, the compensation moments can be determined and applied as a function of the movement phase.

Furthermore, it is additionally or alternatively possible, as described above, to use recording mechanisms or sensors in order to identify or take account of patient movements.

Although modifications and changes may be suggested by those skilled in the art, it is the intention of the Applicant to embody within the patent warranted hereon all changes and modifications as reasonably and properly come within the scope of the Applicant's contribution to the art.

The invention claimed is:

1. A method for acquiring a magnetic resonance (MR) dataset of volume of interest of a subject, said method comprising:
    providing a processor with an electronic input that designates at least one jump in susceptibility that exists in said volume of interest between two sections of said volume of interest;
    in said processor, calculating at least one gradient moment dependent on said at least one jump in susceptibility;
    from said processor, operating an MR data acquisition scanner to execute an MR data acquisition sequence, consisting of gradients pulses and radio-frequency (RF) pulses, that includes radiation of an excitation pulse that excites nuclear spins in said volume of interest;
    for only a limited time during execution of said sequence, operating said MR data acquisition scanner to activate, as part of said sequence, a compensating field comprising at least one finite compensation moment that is effective in a portion of said volume of interest to at least partially compensate said gradient moment caused by said jump in susceptibility;
    from said processor, operating said MR data acquisition scanner, at a time in said sequence that does not encompass said limited time, to read out signals produced by said nuclear spins resulting from said excitation pulse; and
    from said processor, making the read out signal available from the processor in electronic form, as a data file.

2. A method as claimed in claim 1 comprising operating said MR data acquisition scanner to activate a gradient field, as said compensation field that generates said compensation moment.

3. A method as claimed in claim 1 comprising operating said MR data acquisition scanner to radiate a radio-frequency pulse, as said compensation field that generates said compensation moment.

4. A method as claimed in claim 1 comprising operating said MR data acquisition scanner to apply said compensation moment only in one sub-region of said region of interest.

5. A method as claimed in claim 4 wherein said one sub-region is selected as a sub-region of said region of interest in which said at least one jump in susceptibility occurs.

6. A method as claimed in claim 1 comprising using a gradient-echo sequence as said magnetic resonance data acquisition sequence.

7. A method as claimed in claim 6 comprising using a gradient echo imaging sequence as said gradient echo sequence.

8. A method as claimed in claim 1 wherein said subject is a patient, and comprising operating said MR data acquisition scanner to apply said gradient moment in a head region of the patient.

9. A method as claimed in claim 8 wherein said head region comprises at least one of the nose of the patient, the frontal sinus of the patient, or an auditory canal of the patient.

10. A method as claimed in claim 1 wherein the subject is a patient, and comprising operating said MR data acquisition scanner to apply said compensation moment in a region of the upper body of the patient.

11. A method as claimed in claim 10 comprising applying said compensation moment in a region containing the lungs of the patient.

12. A method as claimed in claim 1 comprising providing said computer with a further electronic input that describes a condition in said MR data acquisition scanner that has an effect on said at least one jump in susceptibility, and, in said processor, calculating said gradient moment using said electronic input and said at least one further electronic input.

13. A method as claimed in claim 12 wherein said MR data acquisition scanner comprises a basic field magnet that, during said sequence, generates a basic magnetic field (B0 field), and wherein said further electronic input is an electronic designation of a B0 map that depicts said B0 field in at least a portion of said volume of interest.

14. A method as claimed in claim 12 wherein said excitation pulse produces a B1 field in said MR data acquisition scanner, and wherein said further electronic input is an electronic designation of a B1 map that depicts said B1 field in at least a portion of said volume of interest.

15. A method as claimed in claim 12 wherein said further electronic input is a navigator echo.

16. A non-transitory, computer-readable data storage medium encoded with programming instructions, with said storage medium being loaded into a computer system of a magnetic resonance (MR) apparatus, that comprises an MR data acquisition scanner, said programming instructions causing a computer processor of said computer system, when the non-transitory, computer readable data storage medium is executed by the computer processor, to:

receive an electronic input that designates at least one jump in susceptibility that exists in a volume of interest between two sections of said volume of interest;

calculate at least one gradient moment dependent on said at least one jump in susceptibility;

operate said MR data acquisition scanner to execute an MR data acquisition sequence, consisting of gradients pulses and radio-frequency (RF) pulses, that includes radiation of an excitation pulse that excites nuclear spins in said volume of interest;

for only a limited time during execution of said sequence, operate said MR data acquisition scanner, as part of said sequence, to activate a compensating field comprising at least one finite compensation moment that is effective in a portion of said volume of interest to at least partially compensate said gradient moment caused by said jump in susceptibility;

operate said MR data acquisition scanner, at a time in said sequence that does not encompass said limited time, to read out signals produced by said nuclear spins resulting from said excitation pulse; and make the read out signal available from the computer system in electronic form, as a data file.

17. A magnetic resonance (MR) apparatus comprising:

an MR data acquisition scanner adapted to receive a subject therein, said subject comprising a volume of interest from which MR signals are to be acquired;

a processor provided with an electronic input that designates at least one jump in susceptibility that exists in said volume of interest between two sections of said volume of interest;

said processor being configured to calculate at least one gradient moment dependent on said at least one jump in susceptibility;

said processor being configured to operate said MR data acquisition scanner to execute an MR data acquisition sequence consisting of gradients pulses and radio-frequency (RF) pulses, that includes radiation of an RF excitation pulse that excites nuclear spins in said volume of interest;

said processor being configured to, for only a limited time during execution of said sequence, operate said MR data acquisition scanner as part of said sequence, to activate a compensating field comprising at least one finite compensation moment that is effective in a portion of said volume of interest to at least partially compensate said gradient moment caused by said jump in susceptibility;

said processor being configured to operate said MR data acquisition scanner at a time in said sequence that does not encompass said limited time, to read out signals produced by said nuclear spins resulting from said excitation pulse; and said processor being configured to make the read out signal available from the processor in electronic form, as a data file.

* * * * *